United States Patent

Yoneda

[11] Patent Number: 6,157,690
[45] Date of Patent: Dec. 5, 2000

[54] DIGITAL PLL CIRCUIT

[75] Inventor: Satoshi Yoneda, Kanagawa, Japan

[73] Assignee: NEC Corporation, Tokyo, Japan

[21] Appl. No.: 09/048,883

[22] Filed: Mar. 26, 1998

[30] Foreign Application Priority Data

Mar. 26, 1997 [JP] Japan .................................... 9-073383

[51] Int. Cl.[7] .............................. H03D 3/24; H03L 7/06
[52] U.S. Cl. .......................................... 375/376; 327/158
[58] Field of Search ................................. 375/376, 374, 375/375, 327; 331/1 A, 1 R, 18, 25; 327/158, 149, 156, 161, 163; 713/401, 513

[56] References Cited

U.S. PATENT DOCUMENTS

| | | | |
|---|---|---|---|
| 5,457,718 | 10/1995 | Anderson et al. | 375/373 |
| 5,544,203 | 8/1996 | Casasanta et al. | 375/376 |
| 5,790,612 | 8/1998 | Chengson et al. | 375/373 |
| 5,910,740 | 6/1999 | Underwood | 327/149 |

FOREIGN PATENT DOCUMENTS

| | | |
|---|---|---|
| 58-161426 | 9/1983 | Japan . |
| 63-54018 | 3/1988 | Japan . |
| 193280 | 4/1989 | Japan . |
| 4-505539 | 9/1992 | Japan . |

*Primary Examiner*—Stephen Chin
*Assistant Examiner*—Betsy L. Deppe

[57] ABSTRACT

A PLL circuit comprises a delay control signal generator for increment/decrement of a delay control signal based on a phase lead/lag of an internal clock signal with respect to a reference clock signal, a variable delay circuit for delaying the reference clock signal based on the delay control signal to generate the internal clock signal, and an enable signal generator for retarding the delay control signal generator to increment or decrement the delay control signal for a time length corresponding to the amount of the phase error.

2 Claims, 5 Drawing Sheets

DIGITAL PLL CIRCUIT

BACKGROUND OF THE INVENTION (a) Field of the Invention

The present invention relates to a digital phase locked loop (PLL) circuit and, more particularly, to a digital PLL circuit for generating a clock signal used for synchronization between semiconductor integrated circuits.

(b) Description of the Related Art

PLL circuits are generally used to generate an internal clock signal which is in phase with an input reference clock signal. A digital PLL circuit disposed in a semiconductor integrated circuit receives a reference clock signal and generates an internal clock signal therefrom, and feeds-back the internal clock signal to synchronize the internal clock signal with the reference clock signal.

FIG. 1 shows a conventional digital PLL circuit, which comprises a phase comparator 51, a delay controller 52 and a variable delay circuit 53. The phase comparator 51 compares the phase of a reference clock signal CLK against the phase of an internal clock signal ICK in synchrony with the clock of the reference clock signal CLK to generate a phase lead/lag signal PD representing the result of the comparison. The delay controller 52 responds to an enable signal not shown and the phase lead/lag signal to output a delay control signal CNT by effecting increment or decrement of a previous delay control signal based on the phase lead/lag. The variable delay circuit 53 generates a delay on the reference clock signal CLK based on the amount specified by the delay control signal CNT to generate the internal clock signal ICK.

The conventional digital PLL circuit of FIG. 1 operates for synchronization by controlling the delay time in the variable delay circuit even when only a small difference exists between the phases of the reference clock signal and the internal clock signal. The small phase difference may result from small fluctuation of the internal clock signal due to the coupling between the internal clock line and adjacent signal lines and does not affect the normal operation of the integrated circuit. Similar situation occurs upon an external factor wherein the reference clock signal has a small jitter. These synchronization operations result in excess power dissipation in the semiconductor device.

In addition, if the internal or external factor which has delayed, for example, the internal clock signal disappears in a short time and yet the PLL circuit operates for synchronization by advancing the internal clock signal, the phase shift rather increases after the synchronization. To solve the above problem, it is proposed that the digital PLL circuit operate for synchronization only when the phase lag is detected at successive two or more cycles of the reference clock signal.

FIG. 2 shows a synchronization circuit described in Patent Publication JP-A-1(1989)-93280 for solving the problem described for the conventional PLL circuit. The synchronization circuit comprises a synchronizing signal detecting block, including a shift register 503, a latch circuit 504 and a timing generator 507, for detecting an original super-frame synchronizing signal "b" and a mode-changeover synchronizing signal based on a bit stream signal etc. supplied from a BS tuner not shown.

A frequency divider 510 having a divisional ratio of nine and a synchronization circuit 508 constitute a PLL circuit, wherein the frequency divider 510 functions as a variable delay circuit, for comparing the original super-frame synchronizing signal "b" against the output "c" of the frequency divider 510 to output a super-frame synchronizing signal as an output from the synchronization circuit 508 upon detection of a phase shift at a specified number of successive times. Similarly, a frequency divider 512 having a divisional ratio of ten and a synchronization circuit 509 constitutes another PLL circuit which outputs a mode-changeover synchronizing signal.

The PLL circuits as described above supply stable outputs as the super-frame synchronizing signal and mode-changeover synchronizing signal based on the frame synchronizing signal "a", even when the bit stream signal is attenuated to generate an error in a frame controller for the bit stream signal for a specified number (three, for example) of times in the satellite broadcast communication.

If a phase difference between the external clock signal and the fed-back internal clock signal exceeds a threshold in the circuit of FIG. 5, the large phase difference should be removed as quickly as possible. However, the PLL circuits operate after the phase difference is detected for the specified number of times, which consumes a longer time for synchronization, and may cause a serious problem in the operation of the semiconductor device.

SUMMARY OF THE INVENTION

It is an object of the present invention to provide a PLL circuit capable of reducing power dissipation without reduction of resistance against noise in the power source or jitter in the reference clock signal and without an increase in the pull-in time of the PLL circuit.

The present invention provides a digital phase locked loop (PLL) circuit comprising a phase comparator for comparing an internal clock signal against a reference clock signal to generate a phase lead/lag signal representing whether the internal clock signal leads or lags in phase with respect to the reference clock signal and a phase error signal representing a phase error between the internal clock signal and the reference clock signal, a delay controller for receiving the phase lead/lag signal to increment or decrement a delay control signal based on the phase lead/lag signal, a variable delay circuit for receiving the reference clock signal and the delay control signal to generate the internal clock signal having a phase delay based on the delay control signal with respect to the reference clock signal, and an enable signal generator for receiving the phase error signal to generate an enable signal for allowing or retarding the delay control signal generator based on the phase error to increment or decrement the delay control signal.

In accordance with the PLL circuit of the present invention, the enable signal retards the delay controller to operate for increment/decrement of the delay control signal based on the phase error. As a result, a larger phase error provides an immediate phase shift operation to obtain a reliable operation in a semiconductor device, whereas a smaller phase error provides less quick phase shift operation to reduce power dissipation.

The above and other objects, features and advantages of the present invention will be more apparent from the following description, referring to the accompanying drawings.

DESCRIPTION OF THE PREFERRED EMBODIMENT

Now, the present invention is more specifically described with reference to accompanying drawings.

Figure 3:
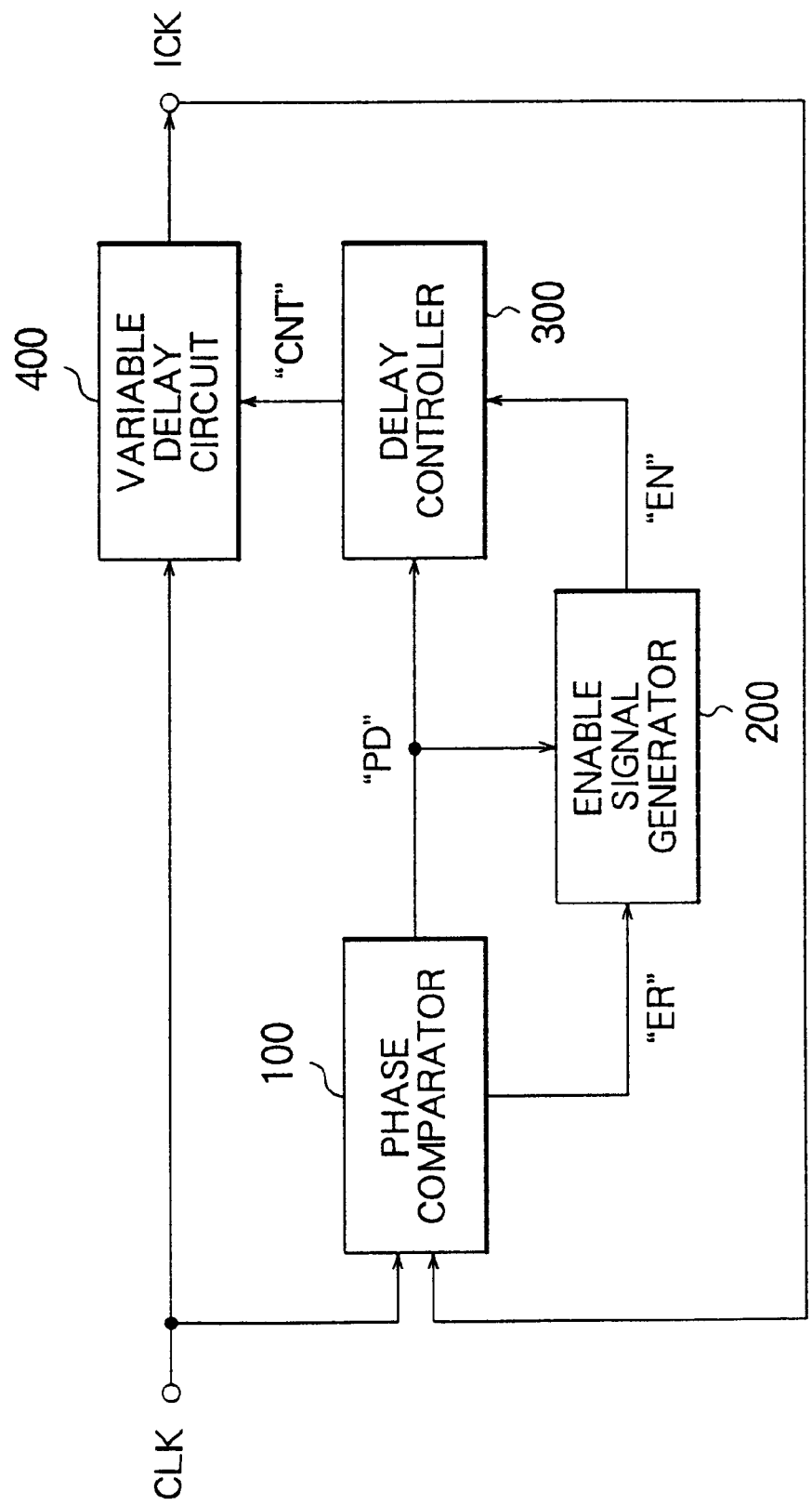
FIG. 3 is a block diagram of a PLL circuit according to an embodiment of the present invention.

Referring to FIG. 3, a PLL circuit according to an embodiment of the present invention comprises a variable delay circuit 400, a phase comparator 100, a delay controller 300 and an enable signal generator 200. The variable delay circuit 400, which is similar to the variable delay circuit 53 in FIG. 1, receives a reference clock signal CLK to generate an internal clock signal ICK having a delay controlled by the value specified by a delay control signal CNT.

Figure 1:
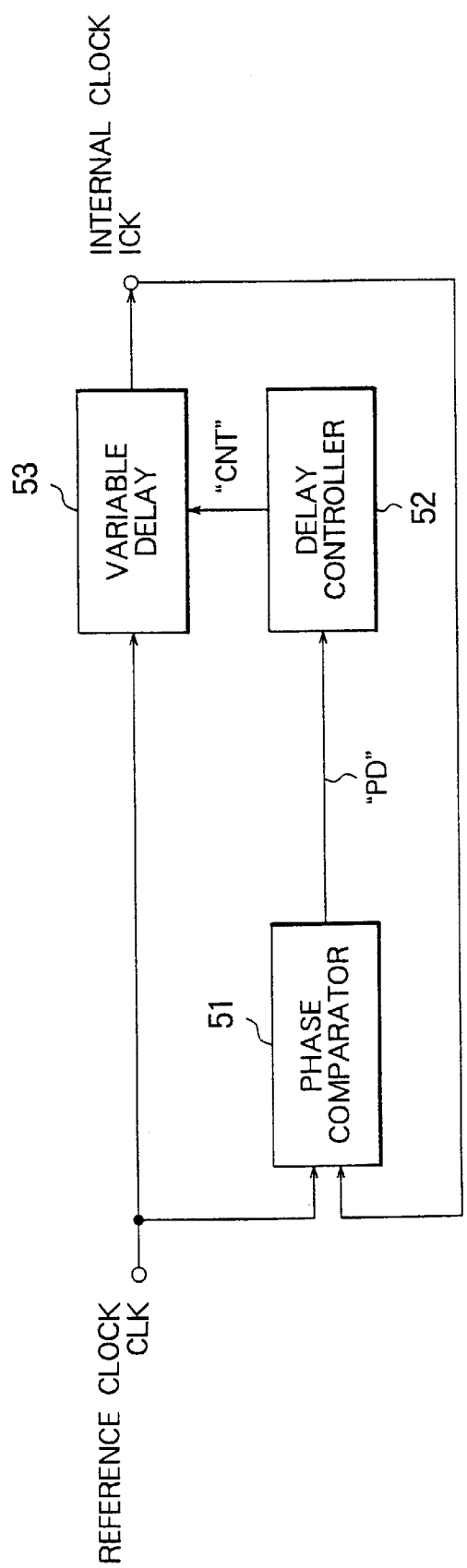
FIG. 1 is a block diagram of a conventional PLL circuit.
Figure 2:
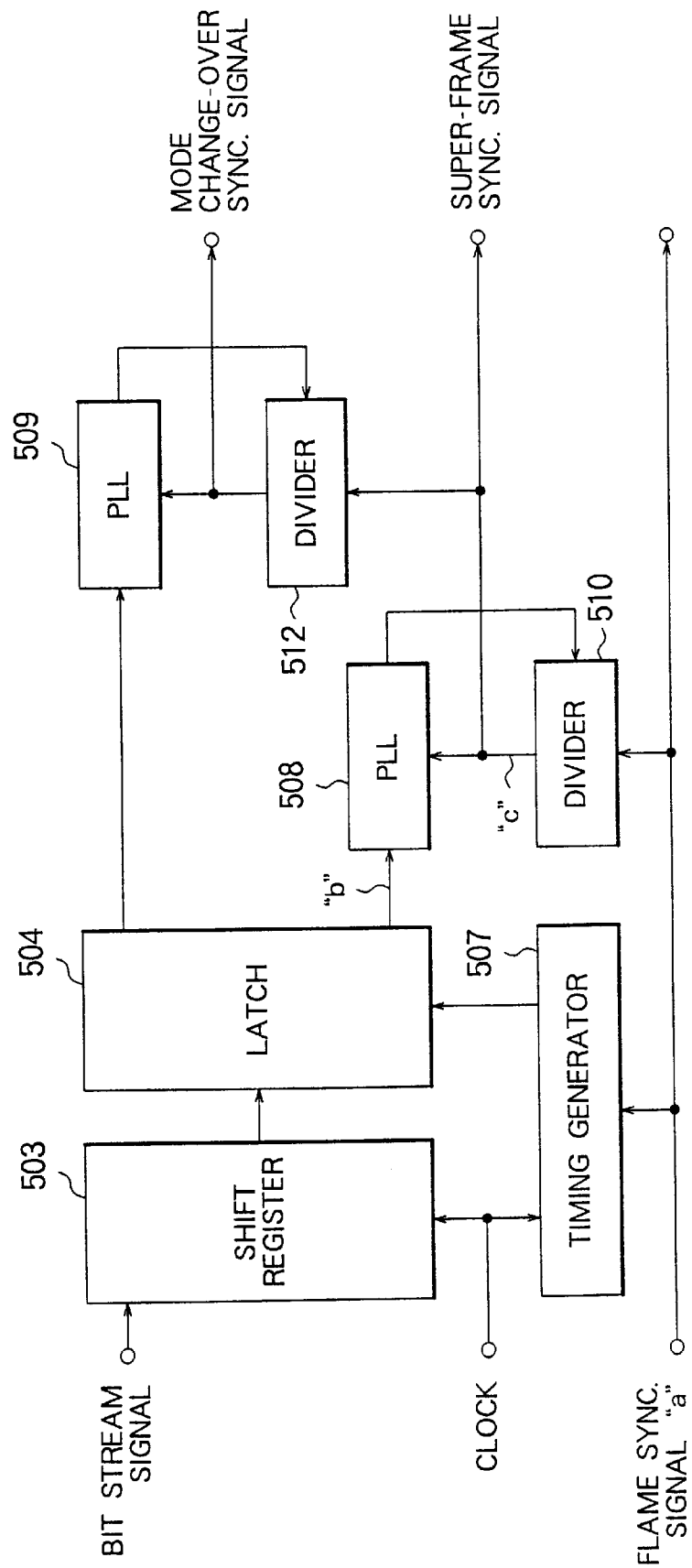
FIG. 2 is a block diagram of a synchronization circuit having conventional PLL circuits.

The phase comparator 100, which is similar to the phase comparator 51 in FIG. 1, responds to the clock pulses in the reference clock signal CLK to compare the phase of the internal clock signal ICK against the phase of the reference clock signal CLK to generate a phase lead/lag signal PD as well as a phase error signal ER including first and second error signals.

Figure 4:
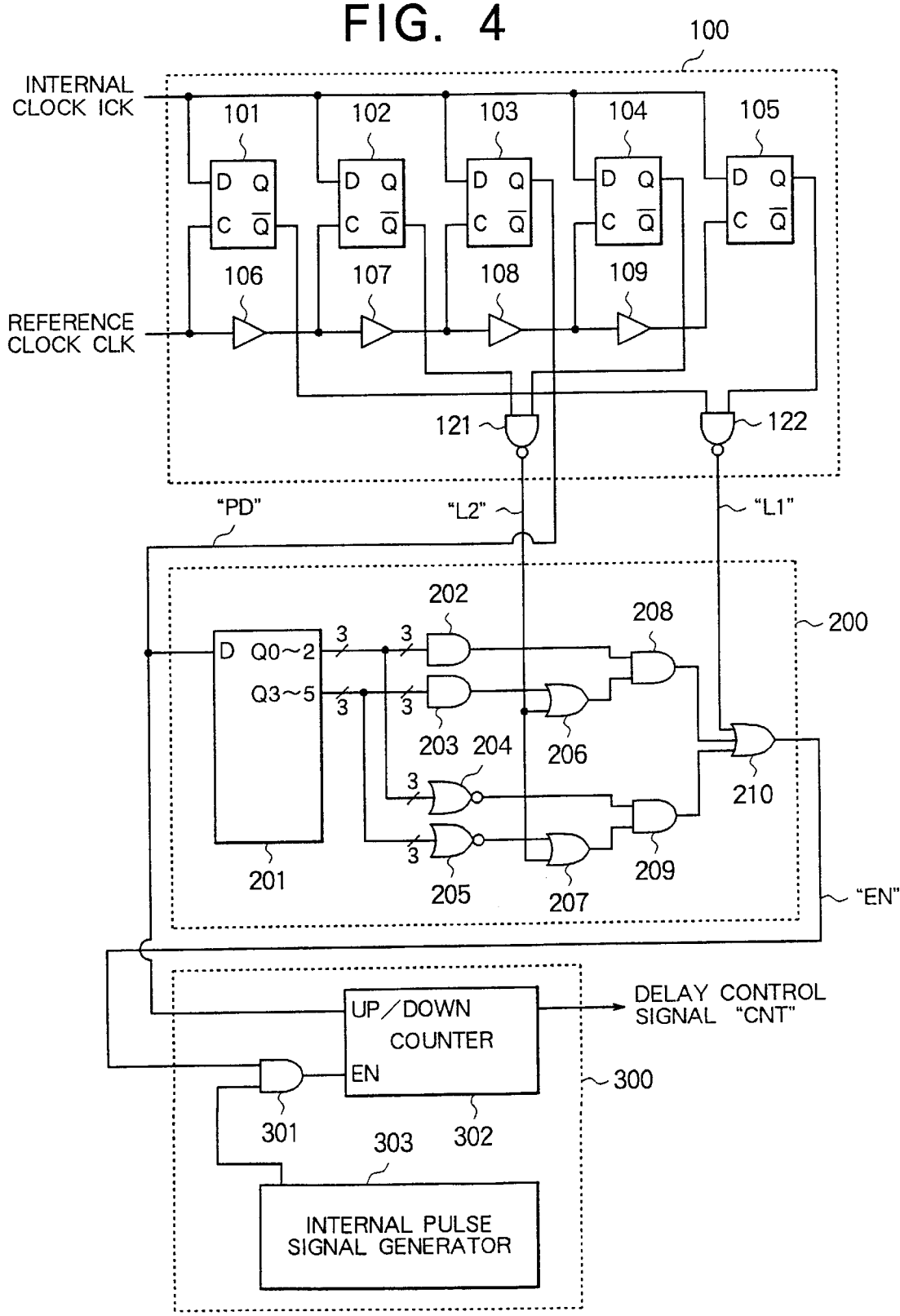
FIG. 4 is a detailed block diagram of a part of FIG. 3.

Referring to FIG. 4, the phase comparator 100 comprises a plurality of (four, in this example) cascaded delay gates 106–109 including the first stage delay gate 106 receiving the reference clock signal CLK, a plurality of (five, in this example) flip-flops 101–105 each receiving the internal clock signal ICK at a data input "D" and the reference clock signal CLK or the output of the corresponding one of the delay gates 106–109 at a clock input "C", a first NAND gate 122 receiving a first input from the inverted data output "/Q" of the first flip-flop 101 and a second input from the data output "Q" of the last flip-flop 105, and a second NAND gage 121 receiving a first input from the inverted data output "/Q" of the second flip-flop 102 and a second input from the data output "Q" of the fourth flip-flops 104.

The third flip- flop 103 outputs the phase lead/lag signal PD from the data output "Q" thereof, whereas the first NAND gate 122 and the second NAND gate 101 output a first error signal L1 and a second error signal L2, respectively. The phase lead/lag signal PD assumes "0" when the internal clock signal ICK lags in phase with respect to the reference clock signal CLK whereas assumes "1" when the internal clock signal ICK leads in phase with respect to the reference clock signal CLK. The first and the second error signal L1 and L2 represent whether the phase of the internal clock signal ICK resides within a first and a second range, respectively, from the phase of the reference clock signal CLK.

The delay controller 300 comprises an internal pulse signal generator 303, an AND gate 301 receiving a first input from the internal pulse signal generator 303 and a second input from the output EN of the enable signal generator 200, an up/down counter 302 receiving the phase lead/lag signal PD at a count input "up/down" and the output of AND gate 301 at an enable input "en". The up/down counter 302 responds to "1" or "0" of the phase lead/lag signal PD to increment or decrement its count, thereby generating a delay control signal CNT based on the count thereof.

The enable signal generator 200 comprises a shift register 201 receiving the phase lead/lag signal PD and having a plurality of (six, in this example) of the shift stages for delivering six bits Q0–Q5 therefrom, an AND gate 202 receiving the lower-order bits Q0–Q2 of the shift register 201, an AND gate 203 receiving the higher-order bits Q3–Q5 of the shift register 201, an OR gate 206 receiving the output of AND gate 203 and the second error signal L2, an AND gate 208 receiving the outputs of AND gate 202 and OR gate 206, a NOR gate 204 receiving the lower-order bits Q0–Q2 of the shift register 201, a NOR gate 205 receiving the higher-order bits of the shift register 201, an OR gate 207 receiving the output of NOR gate 205 and the second error signal L2, an AND gate 209 receiving the outputs of NOR gate 204 and OR gate 207, and an OR gate 210 receiving the outputs of AND gate 208 and AND gate 209 and the first error signal L1.

Figure 5:
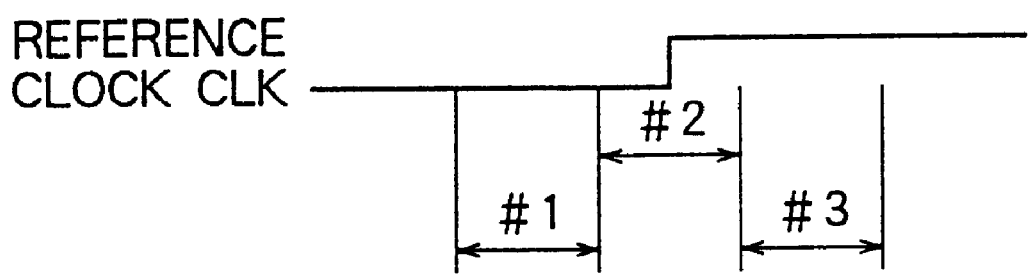
FIG. 5 is a timing chart of the PLL circuit of FIG. 3.

Referring to FIG. 5 showing the detailed waveform of the reference clock signal in the vicinity of a rising edge of a clock therein, a rising edge of a clock of the internal clock signal ICK either resides below range #1, within range #1, within range #2, within range #3, and above range #3. If the rising edge of the internal clock signal ICK is below range #1 or above range #3 due to a large phase error, both the first and second error signals L1 and L2 assume "H", which makes an active high level for the enable signal, thereby enabling the up/down counter 302 of the delay controller 300. Specifically, the up/down counter 302 increments or decrements based on the "1" or "0" of the phase lead/lag signal PD by responding to the pulses of the internal pulse generator 303, to change the previous delay control signal CNT. As a result, the variable delay circuit 400 operates for a phase-matching operation of the internal clock signal ICK with respect to the reference clock signal CLK.

If the rising edge of the internal clock signal ICK resides within range #1 or range #3 in FIG. 5 due to a moderate phase error, the first and the second error signals L1 and L2 assume "L" and "H", respectively, to make a high level for the outputs of OR gates 206 and 207. If the lower-order three bits Q0–Q2 of the shift register 201, which stores consecutive six data of the phase lead/lag signal PD, have an equal value, the output of AND gate 202 or NOR gate 204 assumes a high level, which makes a high level for the output of AND gate 208 or AND gate 209, thereby making an active high level for the enable signal EN. As a result, the up/down counter 302 of the delay controller 300 operates for a phase-matching of the internal clock signal ICK with the reference clock signal CLK. If the lower-order three bits Q0–Q2 have different values, the enable signal EN assumes an inactive low level, thereby disabling the delay controller 300.

If the rising edge of the internal clock signal ICK resides within range #2 due to a stable operation of the PLL circuit, the first and the second error signals L1 and L2 assume a low level, and both the output of AND gate 202 or NOR gate 204 and the output of AND gate 203 or NOR gate 205 assume a high level to output an active enable signal EN only when all the six bits of the shift register 201 have an equal value. In this case, if all the six bits do not have an equal value, the up/down counter 302 do not operate for counting, and a phase control by the variable delay circuit 400 for the internal clock signal ICK is not effected.

In the above embodiment, the phase shift (error) of the internal clock signal ICK with respect to the phase of the reference clock signal CLK is classified into three levels: consistent level, first (moderate) inconsistent level, and a second (high) inconsistent level, and the phase control of the internal clock signal ICK is effected based on the level of the inconsistency. As a result, a higher level of the phase difference between the internal clock signal ICK and the reference clock signal CLK is corrected immediately for a quick response, whereas a lower level of the phase difference is corrected slowly for reduction of power dissipation.

Since the above embodiments are described only for examples, the present invention is not limited to the above embodiments and various modifications or alterations can be easily made therefrom by those skilled in the art without departing from the scope of the present invention.

What is claimed is:

1. A digital phase locked loop (PLL) circuit comprising a phase comparator for comparing an internal clock signal against a reference clock signal to generate a phase lead/lag signal representing whether said internal clock signal leads or lags in phase with respect to said reference clock signal and a phase error signal representing a phase error between said internal clock signal and said reference clock signal, a delay controller for receiving said phase lead/lag signal to increment or decrement a delay control signal based on said phase lead/lag signal, a variable delay circuit for receiving said reference clock signal and said delay control signal to generate said internal clock signal having a phase delay based on said delay control signal with respect to said reference clock signal, and an enable signal generator for receiving said phase error signal to generate an enable signal for allowing or retarding said delay control signal based on said phase error to increment or decrement said delay control signal wherein said enable signal generator further receives said phase lead/lag signal, and said enable signal retards said delay control signal generator for a time length based on said phase error.

2. A digital phase locked loop (PLL) circuit comprising a phase comparator for comparing an internal clock signal against a reference clock signal to generate a phase lead/lag signal representing whether said internal clock signal leads or lags in phase with respect to said reference clock signal and a phase error signal representing a phase error between said internal clock signal and said reference clock signal, a delay controller for receiving said phase lead/lag signal to increment or decrement a delay control signal based on said phase lead/lag signal, a variable delay circuit for receiving said reference clock signal and said delay control signal to generate said internal clock signal having a phase delay based on said delay control signal with respect to said reference clock signal, and an enable signal generator for receiving said phase error signal to generate an enable signal for allowing or retarding said delay control signal based on said phase error to increment or decrement said delay control signal, wherein said enable signal generator further receives said phase lead/lag signal, and said enable signal retards said delay control signal generator for a time length based on said phase error and said phase error signal includes a first error signal representing a first phase error and a second error signal representing a second phase error, and said enable signal retards said delay control signal for a first time length or a second time length based on said first phase error or said second phase error.

\* \* \* \* \*